DIFFUSION BARRIERS FOR SEMICONDUTOR DEVICES

Filed March 6, 1961

INVENTORS.
ROBERT K. WILLARDSON
CHARLES F. ROBINSON
BY
Christie, Parker & Hale
ATTORNEYS.

United States Patent Office 3,080,441

Patented Mar. 5, 1963

3,080,441

DIFFUSION BARRIERS FOR SEMICONDUCTOR DEVICES

Robert K. Willardson and Charles F. Robinson, Pasadena, Calif., assignors to Consolidated Electrodynamics Corporation, Pasadena, Calif., a corporation of California Filed Mar. 6, 1961, Ser. No. 93,615

6 Claims. (Cl. 136—5)

Figure 1:
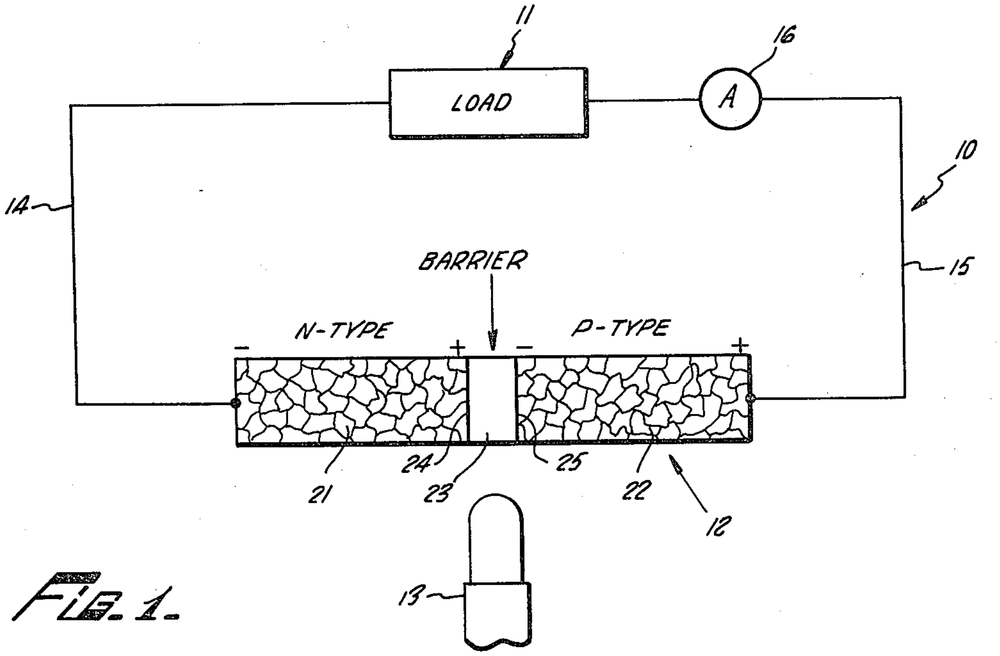

This invention relates to thermoelectric generators. More particularly it relates to thermoelectric generators of the semiconductor type having two dissimilar polycrystalline materials joined together in the region of heat application.

It has long been known that it is possible to generate electricity directly from heat. Originally this was done according to the Seebeck effect by forming a loop from two dissimilar electrical conductors and applying heat at one of the junctions of the conductors while maintaining the other junction of these conductors at a lower temperature. When this is done current flows between the high and low temperature junctions and the current flowing is a function of the dissimilarity of the two conductors and of the temperature differential.

Relatively recently, it has been found that a thermoelectric generator may be fabricated from two dissimilar crystalline materials known as semiconductors or semimetals. Commonly such semiconductors or semimetals may be those such as lead telluride (PbTe), lead selenide (PbSe), or gadolinium selenide ($Gd_2Se_3$). Since these types of crystals appear to be similar, it is necessary to add a small amount of an impurity or doping material to provide the proper dissimilarity between two crystals of these semiconductors. Accordingly, if, say, approximately one hundredth percent (.01%) of antimony (Sb) is added as an impurity during the growth of a crystal of lead telluride, the resultant crystal exhibits a property of having a surplus of conduction electrons. If approximately one hundredth percent (.01%) of silver is added to a lead telluride crystal, the resultant crystal has a deficiency of conduction electrons (it may be said to possess holes). A semiconductor having an impurity taken from the group of elements of phosphorus, arsenic, antimony, or bismuth is said to be an N-type semiconductor; a semiconductor having impurities such as silver, gold, or copper is said to be P-type or acceptor semiconductor. The addition of impurities, such as those mentioned above, to provide the requisite properties in a semiconductor material is known as "doping" and, according to the type of material which is added to the crystal, the addition of impurities further may be known as "P-doping" or "N-doping."

When an N-type and a P-type semiconductor are placed next to one another and the junction between them is heated, the N-type crystal will become positive adjacent the junction and the P-type crystal will become negative; the result is that currents will flow between the two dissimilarly doped crystals to provide a thermoelectric generator.

The efficiency of such a thermoelectric generator is calculated by taking the difference in the absolute temperatures of the two junctions of the system relative to the absolute temperature at the hot junction. Accordingly, $$\mu=\frac{T_2-T_1}{T_2}$$

wherein $\mu$ is the thermoelectric efficiency, $T_2$ is the absolute temperature at the hot junction, and $T_1$ is the absolute temperature at the cold junction. From an expression of this type, it becomes apparent that the efficiency increases as the difference between $T_2$ and $T_1$ increases. Since there is a practical limit to the temperature, usually around room temperature, which may be obtained for $T_1$ in a thermoelectric generator, it is necessary that $T_2$ be of a large value if the generator is to be such that practical economics will allow widespread use.

The matter of economics again enters the picture when the costs of the materials in such a generator are considered. A thermoelectric generator of this type is most efficient and has the longest life when each side of the thermoelectric generator is fabricated from a single doped crystal. However, the cost of such crystals is such that a generator of any practical size becomes nearly prohibitively expensive. Thus, purely as a matter of economics, it is desirable to provide a thermoelectric generator wherein the P-type and N-type materials are much less expensive polycrystalline semiconductors. However, a polycrystalline semiconductor material does not have as long a life at high temperatures as the monocrystalline material.

It has been found that at high temperatures the doping material of the semimetal tends to diffuse across the generator junction leading to a serious degradation in performance that is: the efficiency of the unit falls off as the two original dissimilar materials tend to become more and more alike as the doping materials of each migrate into the other. Such diffusion of the doping material occurs much more easily along the crystal or grain boundaries than through the individual crystals, although the diffusion occurs in both manners. This explains why a thermoelectric generator fabricated from to monocrystalline materials has a longer lifetime than a polycrystalline generator operated at the same temperature.

Generally speaking, this invention comprises a semiconductor device having P-doped and N-doped polycrystalline portions. A monocrystalline semiconductor material is bonded between the N- and P-type doped polycrystalline materials as a diffusion barrier for the doping material in each of the polycrystalline portions. The monocrystalline portion may be stoichiometrically pure or may be P-doped or N-doped.

Figure 2:
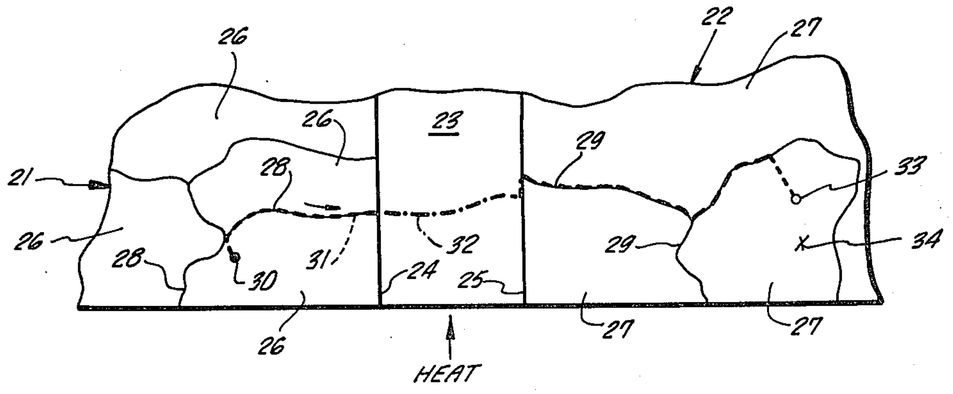

The following detailed description of the invention may be better understood by reference to the accompanying figures, wherein:

FIGURE 1 is a schematic representation of a semiconductor thermoelectric generator of this invention in a circuit; and FIGURE 2 is an enlarged fragmentary representation of the crystalline structure of the major portions of the generator adjacent the monocrystalline barrier element.

Referring to FIGURE 1, there is shown a circuit 10 having an electrical load 11 and a thermoelectric generator 12 in the vicinity of a heat source 13. A conductor or wire 14 extends between the load 11 and the generator 12, and a conductor 15 extending from generator 12 to load 11 completes the circuit. An ammeter 16 is shown in the conductor 15 for indicating current output of the semiconductor thermoelectric generator 12.

The semiconductor generator 12 is comprised of a polycrystalline N-type or electron-donor portion 21 and a polycrystalline P-type or electron-acceptor portion 22 connected to conductors 14 and 15, respectively. A monocrystalline semiconductor element 23 having opposite faces or surfaces 24 and 25 is provided between the N- and P-type portions 21 and 22 with the portions 21 and 22 being bonded to barrier surfaces 24 and 25, respectively. For the purposes of illustration, the N-type crystal 21 may be of lead telluride doped with one hundredth percent antimony (.01% Sb), while the P-type polycrystalline section 22 of the generator 12 may be lead telluride doped with one hundredth percent silver (.01% Ag). The monocrystalline barrier 23 may be stoichiometrically pure or it may be doped with antimony, gold or any other P- or N-type doping material as the specifications of the generator 12 may dictate. When heat is applied in the area of barrier 23, the N-type semiconductor 21 becomes positive adjacent to the barrier 23 while the P-type semiconductor 22 becomes negative. The result is that a current flowing from the generator 12 to the load 11 is indicated by ammeter 16.

According to the kinetic-molecular theory of atomic behavior, all of the atoms of all of the molecules of all materials at any temperature above absolute zero vibrate in direct proportion to the level of the heat of their environment. In gases, the average distance the atoms move is much greater than in a liquid, and the motion in a solid is again much reduced over that of a liquid. Even within solids, there is a wide variation and the average distance travelled by an atom at any given temperature; in an amorphous solid the mean free path of atoms at any given temperature is greater than that in a crystal because of the strong bonding relationships between the atoms of a crystal. In a crystal the atoms stay in the same relative rigid relationship to one another until a temperature is reached whereby an atom may obtain enough energy so that it may break away from its original crystalline location. It may then move through the crystal so long as it maintains this level of energy. However, if the energy level should fall and if the atom should enter a region where another atom has been displaced or moved off, the migratory atom may be locked into a new crystalline relationship. That is, the crystal itself does not change, but the atom has assumed a position in a region of the crystal different from its original location.

Referring to FIGURE 2 where an enlarged idealized representation of the area of the generator 12 around the monocrystalline barrier 23 is presented, the P- and N-type portions 21 and 22 of the generator 12 are composed of a plurality of individual crystals 26 and 27, respectively. Interfaces 28 and 29 exist between crystals 26 and 27, respectively, while no such interfaces are present within the boundaries 24 and 25 of monocrystalline portion 23. An atom 30 of the N-type doping material is shown in one of the individual crystals 26 of the N-type semiconductor portion 21. Upon the application of heat from source 13 to the generator 12, the N-doping atom 30 moves through its crystal 26 to the interface 28 as the normal crystalline molecular vibration amplitudes increase with the increase of heat according to the kinetic-molecular relationships. Upon reaching the interface 28, the atom 30 moves relatively rapidly along interface 28 to the boundary 24 of the monocrystalline barrier 23. If the atom 30 is to migrate through the barrier 23, it does so at a much slower rate (on the order of a thosuand times slower) than the migration along the interface 28. The heavy dashed line 31 indicates rapid migration, while the dot-dash line 32 in crystal 23 represents very slow intracrystalline movement of the impurity atom 30. If the impurity atom 30 reaches the opposite boundary 25 of barrier 23, it has a tendency to move along the boundary 25 to an interface 29 of the P-type portion 22 of the generator 12 and then along the interfaces 29. Eventually, the atom 30 may move into a crystal 27 and become bound in the lattice of one of these crystals 27; this is shown by character 33. If the N-type doping atom 30 should enter a P-type crystal 27, as illustrated at 33, its presence cancels the effect of a P-type doping atom shown by the "X" and characterized as 34. By a similar process, the P-doping impurities 34 may transmigrate through the barrier 23 into the N-type portion 21. The cumulative effect of such migration is the reduction of the effect of doping such that the efficiency of the generator 12 gradually falls off as the redistribution of the doping materials occurs.

The foregoing illustration of the impurity diffusion phenomena is highly idealized, and it should be realized that this is a statistical process wherein only some of the doping impurities actually move from their own crystals, and a small percentage of these actually cross the boundaries 24 and 25 of the barrier 23. Accordingly, when such a monocrystalline barrier is bonded between the N- and P-type cyrstals 21 and 22 of a thermoelectric generator of the type described, the result is marked reduction in the phenomenon of impurity diffusion or migration, the preservation of the thermoelectric efficiency of the circuit 10, and the extension of the effective lifetime of the generator 12. A polycrystalline thermoelectric generator thus may be operated at substantially the same temperature levels of a similar generator fabricated from monocrystalline P- and N-portions.

Throughout the foregoing description, the bonding of the polycrystals to the monocrystal is effected by techniques well-known in the art, such as heating the crystals to about one half of their melting point temperature and applying pressure, or by melting one crystal locally at a surface and fusing it to another crystal.

While this invention has been described above in conjunction with specific apparatus, it is stressed that this description is by way of illustration and example only and is not to be considered as a limitation to the scope of this invention.

We claim:

1. A semiconductor thermoelectric generator comprising a polycrystalline N-type portion, a polycrystalline P-type portion, and a monocrystalline semiconductor portion bonded between the polycrystalline portions.

2. A thermoelectric generator according to claim 1 wherein the monocrystalline portion is P-doped.

3. A thermoelectric generator according to claim 1 wherein the monocrystalline portion is N-doped.

4. A thermoelectric generator comprising an N-doped polycrystalline semiconductor portion having a generator junction surface, a P-doped polycrystalline semiconductor portion having a generator junction surface, and a monocrystalline semiconductor portion having oppositely disposed bonding surfaces, wherein the polycrystalline portions are bonded at their junction surfaces to the monocrystal at the bonding surfaces of the monocrystal.

5. A thermoelectric generator according to claim 4 wherein the monocrystalline portion is stoichiometrically pure.

6. In a semiconductor thermoelectric generator including a first polycrystalline portion having a predetermined impurity added thereto to provide an N-doped portion, and a second polycrystalline portion having a predetermined impurity added thereto to provide a P-doped portion, means for inhibiting the diffusion of the atoms of the impurity from each polycrystalline portion into the other polycrystalline portion comprising a monocrystalline portion bonded between the first and second polycrystalline portions.

References Cited in the file of this patent

UNITED STATES PATENTS

| | | |
|---|---|---|
| 2,898,743 | Bradley | Aug. 11, 1959 |
| 2,961,475 | Sommers | Nov. 22, 1960 |
| 2,986,591 | Swanson et al | May 30, 1961 |